United States Patent
Haun

(10) Patent No.: US 10,368,326 B2
(45) Date of Patent: Jul. 30, 2019

(54) CIRCUIT ARRANGEMENT FOR COMPENSATING FOR SIGNAL ATTENUATION DURING THE TRANSMISSION OF SIGNALS FROM OR TO A MOBILE COMMUNICATIONS DEVICE, AND ASSOCIATED METHOD

(71) Applicant: KATHREIN AUTOMOTIVE GMBH, Hildesheim (DE)

(72) Inventor: Martin Haun, Rosenheim (DE)

(73) Assignee: Kathrein Automotive GmbH, Hildesheim (DE)

( * ) Notice: Subject to any disclaimer, the term of this patent is extended or adjusted under 35 U.S.C. 154(b) by 0 days.

(21) Appl. No.: 16/050,193

(22) Filed: Jul. 31, 2018

(65) Prior Publication Data

US 2019/0045464 A1 Feb. 7, 2019

(30) Foreign Application Priority Data

Aug. 4, 2017 (DE) .......................... 10 2017 117 700

(51) Int. Cl.
*H04W 52/52* (2009.01)
*H04B 1/04* (2006.01)
(Continued)

(52) U.S. Cl.
CPC ............ *H04W 52/52* (2013.01); *H03F 3/189* (2013.01); *H03G 3/20* (2013.01); *H03G 3/341* (2013.01);
(Continued)

(58) Field of Classification Search
CPC ........ H03F 3/189; H03G 3/20; H03G 3/3052; H03G 3/341; H04B 17/318; H04B 1/04;
(Continued)

(56) References Cited

U.S. PATENT DOCUMENTS 5,337,006 A * 8/1994 Miyazaki ............. H03G 3/3047
330/130
5,574,714 A * 11/1996 Masashi ................. G11B 7/005
330/254

(Continued)

FOREIGN PATENT DOCUMENTS

| DE | 10 2013 101 590 | 8/2014 |
| DE | 10 2013 207 898 | 10/2014 |
| WO | 2013/028913 | 2/2013 |

OTHER PUBLICATIONS

"WCDMA for UMTS", Third Edition, Edited by Harri Holma and Antti Toskala, Wiley, Mar. 2016, 4 pages.

*Primary Examiner* — Tan H Trinh
(74) *Attorney, Agent, or Firm* — Nixon & Vanderhye P.C.

(57) ABSTRACT

A circuit arrangement for compensating for signal attenuation during the transmission of transmission signals of a mobile communications device includes at least one amplifier is switched out of the signal transmission path or is deenergized, or does not amplify, attenuate or forward the detected input signal, unless an input signal level is detected which is greater than or equal to the input signal detection level ($S_{EP}$) or a trigger level ($S_{AP}$) which is at most 10 dB higher than the same. Alternatively or in combination, the amplifier is operated at a variable amplification factor in an adjustment range (X1) which begins at an input signal detection level ($S_{EP}$) or a trigger level ($S_{AP}$) which is at most 10 dB higher than the same, and extends to cover higher signal levels than these, wherein, if the input signal detection level ($S_{EP}$) or the trigger level ($S_{AP}$) is reached or exceeded, the input signal is either non-amplified or is attenuated at an amplification factor≤1.

20 Claims, 4 Drawing Sheets

(51) Int. Cl.

| | |
|---|---|
| *H04W 52/28* | (2009.01) |
| *H04W 52/24* | (2009.01) |
| *H03F 3/189* | (2006.01) |
| *H03G 3/20* | (2006.01) |
| *H04W 52/36* | (2009.01) |
| *H04B 17/318* | (2015.01) |
| *H03G 3/34* | (2006.01) |
| *H03G 3/30* | (2006.01) |

(52) U.S. Cl.
CPC ............. *H04B 1/04* (2013.01); *H04B 17/318* (2015.01); *H04W 52/247* (2013.01); *H04W 52/283* (2013.01); *H04W 52/367* (2013.01); *H03G 3/3052* (2013.01); *H04B 2001/045* (2013.01); *H04B 2001/0416* (2013.01)

(58) Field of Classification Search
CPC ..... H04B 2001/0416; H04B 2001/045; H04W 52/247; H04W 52/283; H04W 52/367; H04W 52/52
USPC ......... 455/126, 69, 115, 127, 522, 278, 279, 455/127.2, 234.1, 450; 327/308; 375/297; 330/291; 324/74
See application file for complete search history.

(56) References Cited

U.S. PATENT DOCUMENTS

| | | | |
|---|---|---|---|
| 5,752,171 A * | 5/1998 | Akiya | H03G 3/3042 330/279 |
| 5,832,373 A * | 11/1998 | Nakanishi | H03G 3/3042 455/126 |
| 5,877,653 A * | 3/1999 | Kim | H03F 1/3229 330/149 |
| 6,148,185 A * | 11/2000 | Maruyama | H03F 1/3235 330/151 |
| 7,783,318 B2 | 8/2010 | Wilson et al. | |
| 9,559,639 B2 * | 1/2017 | Su | H03F 1/52 |
| 2003/0006839 A1 * | 1/2003 | Chominski | G01R 15/12 330/140 |
| 2006/0091950 A1 * | 5/2006 | Hayase | H03F 1/3247 330/149 |
| 2006/0099918 A1 * | 5/2006 | Yamaguchi | H03C 3/06 455/126 |
| 2007/0042736 A1 * | 2/2007 | Tateno | H03G 3/3042 455/234.1 |
| 2008/0076437 A1 * | 3/2008 | Wilson | H04B 7/15535 455/450 |
| 2008/0111623 A1 * | 5/2008 | Magnusen | H03G 3/30 330/151 |
| 2009/0318133 A1 * | 12/2009 | Azuma | H03G 3/3052 455/423 |
| 2012/0007580 A1 * | 1/2012 | Kim | G01R 27/02 324/74 |
| 2013/0082781 A1 * | 4/2013 | Van Buren | H03G 3/20 330/279 |
| 2013/0090077 A1 * | 4/2013 | Rozenblit | H04W 52/52 455/127.2 |
| 2013/0243125 A1 * | 9/2013 | Matsubara | H04B 1/62 375/297 |
| 2013/0285748 A1 * | 10/2013 | Hongo | H03F 1/0222 330/291 |
| 2013/0335146 A1 * | 12/2013 | Takahashi | H03G 3/3052 330/279 |
| 2015/0156054 A1 * | 6/2015 | Hirano | H04L 27/364 455/102 |

\* cited by examiner

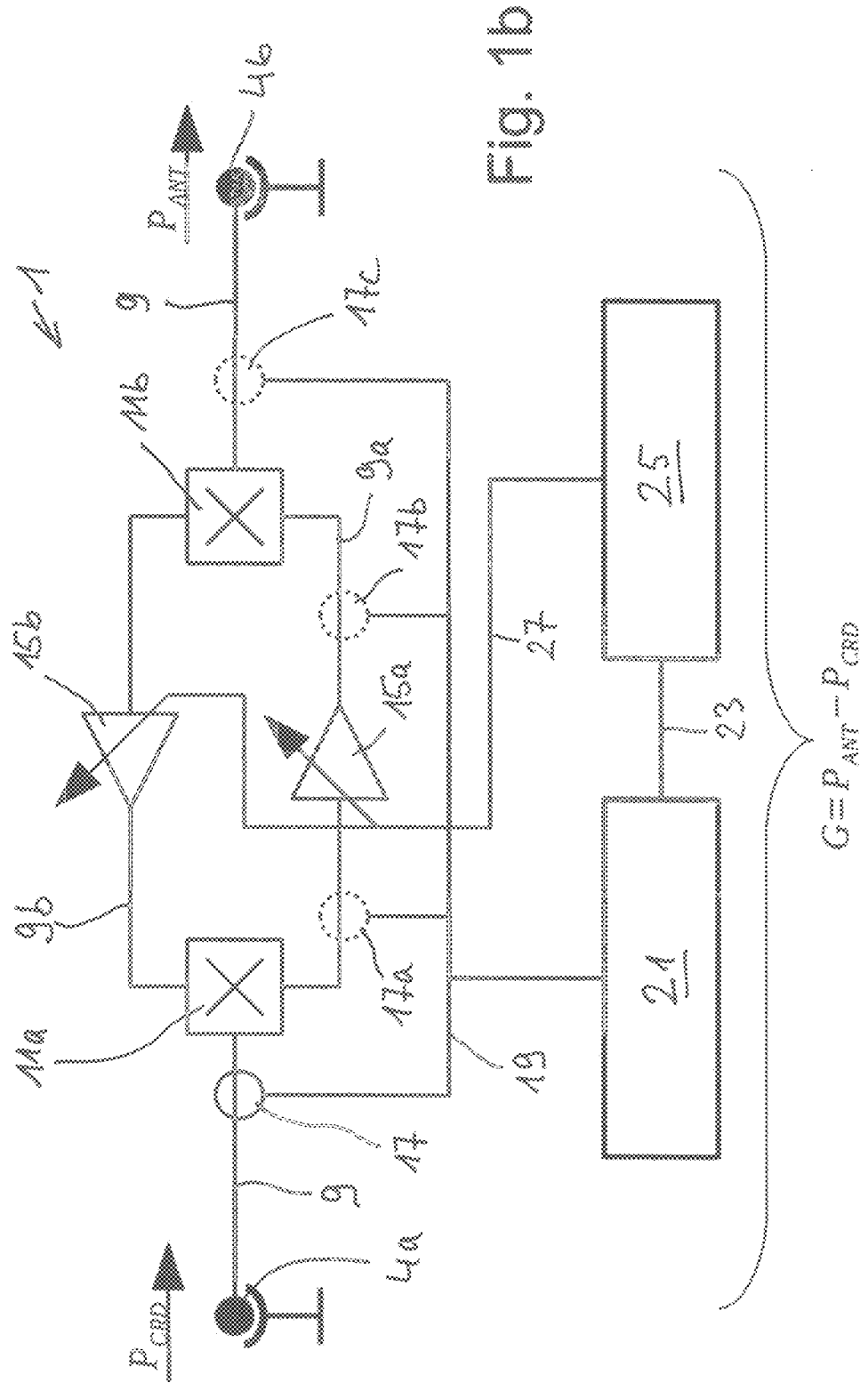

CIRCUIT ARRANGEMENT FOR COMPENSATING FOR SIGNAL ATTENUATION DURING THE TRANSMISSION OF SIGNALS FROM OR TO A MOBILE COMMUNICATIONS DEVICE, AND ASSOCIATED METHOD

CROSS-REFERENCE TO RELATED APPLICATION

This application claims priority to DE Patent Application No. 10 2017 117 700.0 filed Aug. 4, 2017, the entire content of which is hereby incorporated by reference.

FIELD

The technology herein relates to a circuit arrangement for compensating for signal attenuation during the transmission of signals from or to a mobile communications device, and to an associated method.

BACKGROUND & SUMMARY

It is known that mobile communications networks are constructed in cells for the widest possible coverage. A mobile communications cell is usually formed by a base station to which mobile communications antennas are typically fixed.

By means of these antennas of the base station, a corresponding cell is "illuminated". As a consequence, a subscriber which is located within this mobile communications cell, and is typically mobile, can conduct communication with the base station and can have conversations with other subscribers in other mobile networks or in landline networks, for example.

The communication between the base station and mobile communications devices in a mobile communications cell is carried out using radio waves—as is known. As a mobile communications device increasingly approaches the cell boundary of a mobile communications cell, it requires increasingly greater energy to communicate with the base station. In other words, the mobile phone must now transmit more "loudly"—that is, increase its signal level—in order to be "heard".

As the mobile communications device approaches closer to a base station, the required transmission power—the signal level—is regulated downwards. The mobile phone communicates increasingly more "quietly" with the base station.

The manner in which the communication between the base station and the mobile communications device works is specified by a number of regulations. These regulations specify maximum transmission strengths (signal levels), as well as minimum transmission strengths—generally depending on the given technology. According to the mobile communications standard (GSM, UMTS, LTE), there are different values for maximum/minimum signal levels.

The manner in which the transmission power of a mobile communications device is modified and/or regulated is found, by way of example, in the publication "WCDMA FOR UMTS", third edition, Harri Holma and Antti Toskala, WILEY; (publication date: March 2016 (reprinted); general technical background). For example, page 55 and page 56, in the chapter "Power Control" state that whenever the mobile communications device in a mobile communications cell transmits with too strong a signal, the base station instructs the mobile communications device to lower the transmission power. If the transmission power of the mobile communications device is too low, the mobile communications station instructs the mobile communications device to increase its transmission power again. A corresponding measurement and instruction cycle is performed 1500 times per second, for example.

A known, fundamental problem arises in this context. The mobile communications devices (controlled by the base station) must be controlled at different distances from the base station in such a manner that the signal strengths at the base station are comparably high, such that no mobile communications device can "drown out" another—in other words, such that reliable communication can accordingly be carried out between a base station and all mobile communications devices in a cell.

If the mobile communications device is used in a motor vehicle, for example—rather than outdoors—it is generally advisable for a motor vehicle antenna mounted outside the motor vehicle to be used in order to handle the communication with a base station.

However, this requires the use of a corresponding coupling and line structure via which the transmission signals can be transmitted from the phone to the vehicle antenna—and vice versa when signals are received. However, the use of such a coupling and line structure ultimately causes an additional attenuation, which is why corresponding transmission signals not emitted by the mobile communications device itself, but via the motor vehicle antenna, would have a lower transmission power (lower transmission level).

In light of this context, the practice of inserting corresponding amplifier circuits which serve to compensate for the attenuation of the signal strength is known.

In this case, it is generally desirable for the amplifier (signal booster) to equalise or compensate for the existing additional attenuation (which is why these amplifiers are also sometimes called compensators) such that the communications between the motor vehicle exterior antenna and the base station can be conducted in exactly the same way as if the mobile communications device were used outdoors, outside of a motor vehicle, within a mobile communications cell without such an amplifier.

The aim of such an amplifying apparatus, and an associated control thereof, is to compensate for the additional attenuation caused by the coupling and line structure—which results in the reduction of transmission power.

Ideally, the amplifying apparatus would compensate for this attenuation in such a way that the transmission power at the motor vehicle antenna would be exactly the value at which a mobile communications device outdoors would communicate with a base station without such an amplifier.

In other words, therefore, the compensation is ideal and thus optimal with respect to signal attenuation in the transmission of transmission signals of a mobile communications device if the amplifying apparatus—that is, the circuit arrangement for compensating for signal attenuation—transmits in an identical manner to the transmitting power at which a mobile communications device would transmit when outdoors, for all transmissions of the transmission signals of a mobile communications device under the greatest possible range of operating conditions and especially under critical operating conditions, at a great distance as well as at a short distance from the base station. The specified values for the maximum and minimum signal level may not be exceeded. Also, it must be ensured that these values are reached.

In this context, DE 10 2013 101 590 A1 has suggested using at least one amplifier to compensate for an attenuation occurring on a signal path between a mobile terminal and an antenna, via which transmission signals originating in the mobile communications device can be amplified or attenuated. For this purpose, the circuit arrangement comprises a detection unit for detecting an input signal level from the mobile communications device, and a control unit for adjusting the amplification factor of the at least one transmission signal amplifier.

In order to take into account the regulations regarding the transmission power of a mobile communications device in a cell of a base station, the control unit of the compensator is configured to set a predetermined minimum amplification factor if the detected antenna signal power is less than a prespecified threshold value. This is to ensure that when the mobile communications device is near the base station, it actually transmits via an antenna usually located on the outside of the vehicle using only transmission signals in an order of magnitude which corresponds to that of the transmission level transmitted from the base station to the mobile communications device, and does not exceed this level.

Also, the control unit is configured to reduce the amplification factor in such a manner that the amplification factor is reduced to a value at which the transmission signal power of the compensator is maximised to and does not exceed a prespecified maximum value when the detected transmission signal power should exceed a prespecified maximum value.

An antenna arrangement comparable in this respect, and a regulating mechanism which is likewise comparable in this respect, have also become known from DE 10 2013 207 898 A1.

According to this prior publication, a circuit arrangement for compensating for signal attenuation during the transmission of transmission signals of a mobile communications device (via the aforementioned circuit arrangement and an antenna which is usually mounted on the outside of a motor vehicle) comprises a detector arrangement which is designed to detect whether a detected input signal level of the compensator reaches or exceeds a prespecified upper value, and whether the detected (amplified) input signal level of the compensator drops to or drops below a prespecified lower value.

If the upper value for the accordingly detected input signal level of the compensator is reached or exceeded, the adjusting apparatus should be prompted to reduce the signal level amplification generated by the signal level amplifying apparatus. Likewise, the detector arrangement should be designed in such a manner that the adjusting apparatus is prompted to likewise reduce the signal amplification generated by the signal level amplifying apparatus if the lower value is reached or passed.

For example, if the mentioned signal level amplifying apparatus comprises a signal amplifier which cooperates with an attenuation apparatus, the amplification or the attenuation can be adjusted via the attenuation apparatus. In this case, when the upper value is reached or exceeded, or when the lower value is reached or passed, the signal attenuation produced by the attenuation apparatus would be increased to ultimately reduce the signal amplification overall.

Non-limiting embodiments herein accordingly to provide an improved circuit arrangement for compensating for signal attenuation during the transmission of signals from or to a mobile communications device, and an improved method for this purpose.

In the context of example non-limiting embodiments, several surprising advantages are produced.

While in known solutions according to the prior art, the detection sensitivity of the detection apparatus is relatively high, or even as large as possible (so that even the lowest transmission signal level of the mobile communications device can be detected immediately), the example non-limiting technology herein proposes preferably reducing this detection sensitivity—that is, to shift it to higher levels. The consequence of this approach is that transmission signals of the mobile communications device are detected only after exceeding a higher level or threshold value, and the circuit arrangement is only ready to provide a corresponding amplification—that is, to amplify the transmission signal of the mobile communications device according to the control mechanism—from this transmission signal detection level and above. This initially provides the advantage that less energy is needed because the amplification control is only implemented at a later point in time.

Furthermore, this achieves the essential advantage that—in particular at very low signal levels (in particular, transmission signal levels) below the transmission signal generation level—no amplification is performed which would be too strong in some circumstances—i.e. an overcompensation—as a result of potential erroneous values. In other words, it is always ensured that, particularly when a mobile communications device is positioned close to a base station, the low transmission level set by the mobile communications device in coordination with the base station is always maintained, and the signal attenuation prespecified by the circuit arrangement is always attenuated in this prespecified attenuation—but in any case is not improperly amplified in an impermissible manner.

As long as the detected input signal and/or the detected input signal level of the compensator is below a detection level or below a lower trigger level, no transmission and amplification path is offered via the circuit arrangement (apart from parasitic crossovers), such that the communication between the mobile communications device and the base station is conducted through the vehicle body shell (which has finite attenuation).

Another important advantage is that, in the context of example non-limiting embodiments, whenever a detected input signal level of the compensator drops below a lower, prespecifiable level threshold (which is termed the transmission signal detection level and is preferably significantly higher than the lowest transmission level of a mobile communications device), preferably no amplification of the signal level is initiated. Rather, in contrast, the mobile communications device is not requested to implement an amplification in this case. Preferably, an attenuation is even provided in this case.

Because of the shift in the detection sensitivity towards higher levels, as preferably provided as part of the example non-limiting embodiments (which ultimately reduces the detection sensitivity compared to the prior art), and because of the modified amplification circuit preferably additionally provided as part of the example non-limiting implementations, in which the circuit arrangement preferably provides an attenuation rather than any amplification after the detection of the transmission band of the mobile communications device (after the signal level adjusted according to the detection sensitivity has been exceeded), not only is energy saved, but in addition, compared to conventional solutions there is much more certainty that, when the mobile communications device is in a position close to the base station, the mobile communications device transmits at the low transmission power, the value of which is specified by the base station. If the value of the mobile communications device is too low due to the attenuation, it can receive an instruction from the base station to set a correspondingly higher set value for the transmission level. Raising the detection threshold offers a number of additional advantages, namely:

achieving a lower sensitivity to mobile communications devices which are not placed in a coupling holder located in a motor vehicle, by way of example;

the aforementioned lower detection sensitivity, with the detection threshold raised, also leads to a desirable lower sensitivity to Bluetooth and WLAN signals;

in addition, an unintended response to transmission signals of further mobile telephones which are coupled into the circuit via the vehicle antenna is prevented by the low sensitivity of the selective detectors;

the reduction in system sensitivity can also make it possible for only the direct path between the mobile communications device and the base station to be active near the base station. In other words, the transmission power of a mobile communications device close to a base station is not sufficient to reach the detection threshold of the circuit arrangement (that is, the compensator) which is elevated according to example non-limiting embodiments;

in addition, the lower detection sensitivity of the detector apparatuses makes it possible to dispense with amplifiers and/or amplifier powers and filters, thereby reducing the overall assembly complexity;

significant advantages arise in terms of the insulation between the various circuit groups of the circuit arrangement; the sensitivity of the detector paths according to the prior art results in a variety of problems, since the dynamics to be processed on the circuit board can amount to approximately 90 dB—for example, in the case of LTE circuit arrangements (compensators); this can lead to almost unsolvable problems with regard to the required insulation of the various circuit groups from each other. Specifically, in the context of example non-limiting embodiments, it has been shown that particularly high blocking levels at the vehicle antenna due to third-party mobile phones or other communications modules on the same antenna can lead to a response of the detector paths, thereby significantly limiting the functionality of the circuit arrangement—that is, the compensator.

In this case, the amplification provided as part of example non-limiting embodiments is preferably equipped with a low-pass response after the triggering threshold of the detection sensitivity is exceeded (i.e. when the higher signal level is exceeded), in order to prevent the two controls—namely the control prespecified by the compensator and the control prespecified by the network operator via the base station—from being triggered.

The solution according to example non-limiting embodiments further ensures that—due to the amplifier power being switched on and off (which occurs immediately when a lower threshold or detection level is passed, as described in DE 10 2013 207 898 A1, for example)—it is not possible for a so-called "ping-pong" effect to arise. This will be explained below.

If, for example, a vehicle is far away from a base station, then the mobile communications device receives the instruction from the base station to transmit at a comparably high signal level. Accordingly, the circuit arrangement is switched into and operated in a corresponding circuit mode for compensating for the transmission signal. The total attenuation loss which arises due to the coupling attenuation between the mobile communications device and receiver of the compensation circuit apparatus, and due to the transmission path in the circuit itself, is usually compensated for by a corresponding communication between the base station and the mobile communications device since the mobile communications device receives corresponding instructions to transmit at a transmission power which is sufficiently high that, taking into account the amplifier circuit, the mobile communications device ultimately emits via the vehicle antenna at the transmission power desired by the base station.

If the vehicle then moves closer to the base station, the transmission level of the transmission signal emitted by the mobile communications device is increasingly down-regulated with increasing proximity to the base station (due to the corresponding instruction from the base station), the amplifying apparatus of the compensator ultimately turning off the amplification abruptly when the corresponding detector sensitivity—generally the prespecified lower detection level—is reached. As a result, the transmission level of the transmission signal transmitted via the vehicle antenna is abruptly reduced, the level reduction which results being abruptly recognisable by the base station as well.

Therefore, the base station in this case will also abruptly transmit the information to the mobile communications device to quickly elevate the transmission level. As a result, a situation like that described for the starting point is reached, as if the mobile communications device is at a greater distance from the base station and the power of the transmission signal is additionally elevated via the amplifier. This accordingly leads to the undesired "Ping-pong" effect.

The "ping-pong" effect described here must absolutely be prevented for reasons of network stability. This is also reliably ensured by example non-limiting embodiments.

BRIEF DESCRIPTION OF THE DRAWINGS

Example non-limiting embodiments will be explained in more detail below with reference to drawings, in which:

FIG. 1b: shows a schematic circuit diagram of a circuit arrangement according to example non-limiting embodiments;

DETAILED DESCRIPTION OF NON-LIMITING EMBODIMENTS

Figure 1A:
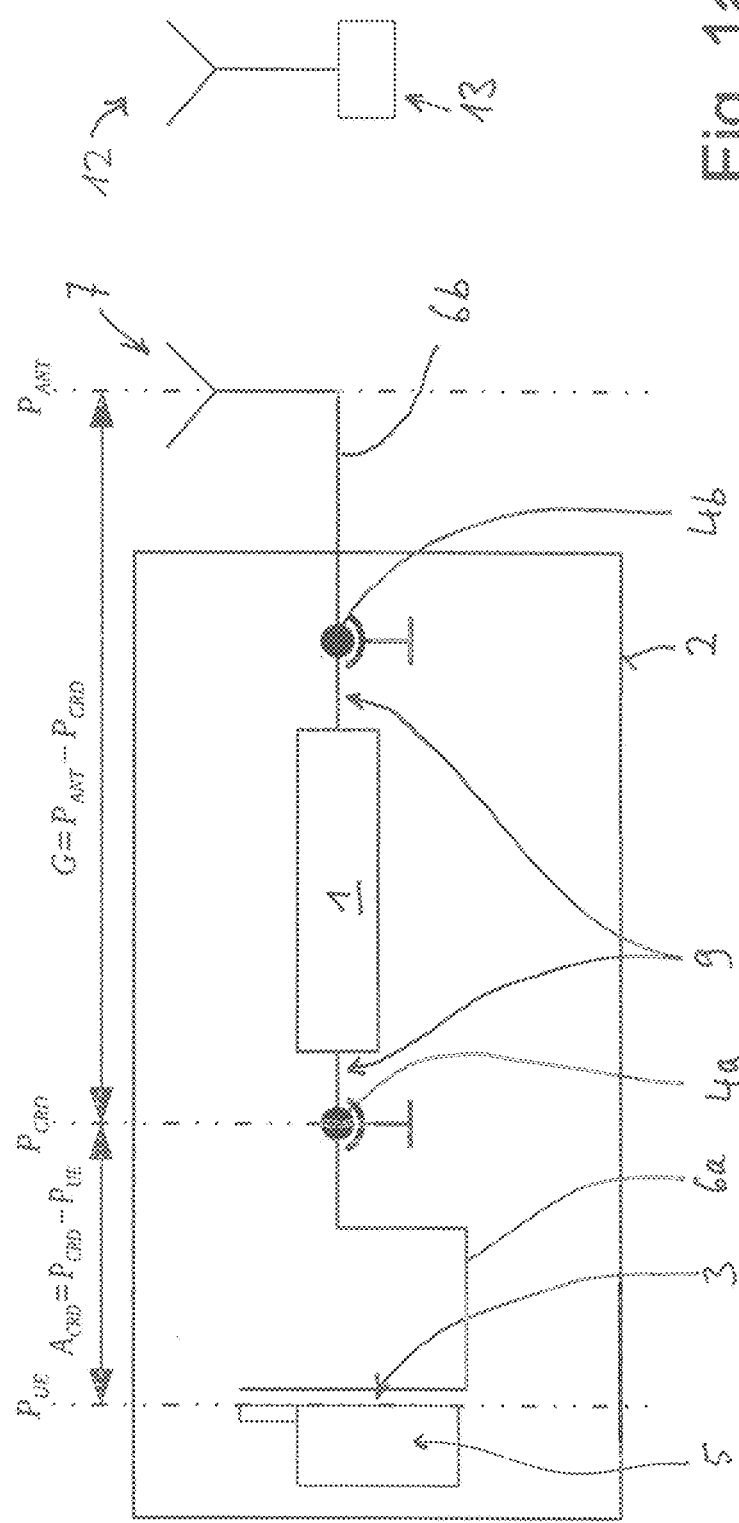
FIG. 1a: is a schematic overall view of a circuit arrangement according to example non-limiting embodiments, specifically interacting with a mobile communications device and an antenna generally attached to an automotive shell (body) of a motor vehicle.

FIGS. 1a and 1b show a schematic circuit arrangement 1 for compensating for an attenuation which arises on a signal line—by way of example between a mobile communications device and an antenna.

The circuit arrangement 1 comprises a coupling apparatus 3—for example, in the form of a coupling holder (sometimes called a "cradle")—in which a mobile communications device 5 can be placed, by way of example. The coupling apparatus 3 in this case can produce a signal transmission together with the mobile communications device in all suitable ways—for example, electromagnetic, inductive and/or capacitive or galvanic.

Between the coupling means 3 and an antenna 7 there is a signal line 9 which can be split into at least two paths 9a, 9b at least in a portion of the signal line—for example via a duplexer 11a in the mobile communications device and a duplexer 11b in the antenna. The first signal path 9a is provided for the transmission of transmission signals, and the second signal path 9b running parallel thereto is provided for the transmission of received signals. The term 'transmission signal' is used for transmission signals emitted from the mobile communications device 5 to an antenna 12 of a base station 13, whereas 'received signals' are those which are transmitted from the base station 13 in the direction of the mobile communications device 5 (from the perspective of the mobile communications device).

In FIG. 1a, the schematic overall structure is indicated, specifically having a vehicle or cabin body 2, which ultimately results in a portion of the additional attenuation of a transmission signal of the mobile communications device 5 due to penetration losses EV. This is shown schematically in FIG. 1a. FIG. 1a also shows the antenna 7 mounted on the outer shell of the vehicle or cabin, sometimes referred to as the vehicle or exterior antenna 7. Likewise, the coupling apparatus 3 in the form of a "cradle"—that is, a coupling holder in which the mobile communications device can be inserted—is shown schematically in FIG. 1a. This also results in a coupling attenuation which contributes to the total attenuation. The illustrated circuit apparatus 1 can be connected between a connector 4a for the mobile communications device and a connector 4b for an antenna. Reference numeral 6a also indicates the portion of the signal transmission line which extends from the coupling apparatus 3 to the mobile communications device connector 4a of the circuit arrangement 1. Reference numeral 6b denotes the section of the signal transmission line from the connector 4b to the antenna 7.

The corresponding structure will be explained below for only one frequency band. If necessary, it is possible that a plurality of transmission lines, both in the transmitting and in the receiving direction, are provided for a plurality of frequency bands. In this case, the detector apparatus 21 must be designed in such a manner that a corresponding signal level can be detected for each of the different frequency bands. This may be accomplished by a plurality of separate detector apparatuses or one shared detector apparatus adjusted and tuned to measure multiple signal levels in multiple frequency bands. In this respect, reference is made to known circuits.

In the embodiment shown, the transmission path 9a and the receiving path 9b each have an amplifier 15a and 15b, respectively, to amplify the transmission and received signals.

The circuit and control according to example non-limiting embodiments are explained below, primarily with respect to the detected input signal level of the compensator, a corresponding control also being possible in principle proceeding from and on the basis of the received signals, as is customary particularly in North America.

In the embodiment shown, a coupling apparatus 17 is provided at a suitable point of the signal line 9—by way of example on the transmission path 9a in the illustrated embodiment—via which a detected input signal level of the compensator can be output, the detected input signal level being initiated by the transmission signal level of the mobile communications device. This transmission signal level of the mobile communications device is not known because there is no exact information as to how much this transmission signal level of the mobile communications device is attenuated. As a result, only the detected transmission signal level applied to the input of the compensator is ultimately available for further processing.

A detector apparatus 21 is included on the output line 19 and ultimately serves to evaluate the detected input signal level. This detector apparatus 21 is connected via a line 23 to an adjusting and/or control unit 25, which is connected via a control line 27 in the illustrated embodiment to the amplifier 15a provided on the transmission path 9a, as a result of which the amplification and/or attenuation in the amplifier 15a can be adjusted accordingly.

FIG. 1a also includes an initial attenuation line, having an attenuation value $A_{CRD}$—specifically between the coupling apparatus 3 and the connector 4a for the mobile communications device. This value can be expressed as $$A_{CRD} = P_{CRD} - P_{UE}.$$

An amplification region adjoins said line, specifically between the connector 4a for the mobile communications device and the antenna 7, this amplification region G being able to be expressed as $$G = P_{ANT} - P_{CRD}.$$

In other words, a transmission signal having a power $P_{ANT}$ is emitted at the antenna 7.

In the embodiment according to FIG. 1b, the coupling apparatus 17 is included on the portion of the signal line 9 which is arranged between the mobile communications device 5, in particular between the associated connector 4a for the mobile communications device and the duplexer 11a for the mobile communications device—that is, on a portion of the signal line on which there has not yet been any amplification (or attenuation) of the transmission signal coming from the mobile communications device.

However, FIG. 1b also shows second, further possible positions for a coupling apparatus 17—specifically, a coupling apparatus 17a which is shown by a dotted line between the duplexer 4a for the mobile communications device and the amplifier located in the transmission signal path 9a. Alternatively or in addition to one or both other positions of a coupling apparatus 17, a coupling apparatus 17b arranged downstream of the transmission signal amplifying apparatus 15a in the embodiment shown on the transmission path 9a and/or the signal line 9 could also be provided. In this variant, the coupling apparatus 17b is arranged on the transmission signal transmission path 9a upstream of the duplexer 11b for the antenna.

Finally, however, FIG. 1b also shows a third point at which a coupling apparatus 17c could be arranged, namely on the portion of the signal line 9 which is common to the receiving and transmitting directions—specifically, by way of example, between the duplexer 11b for the antenna and the connector 4b for the antenna of the circuit arrangement.

It should be noted at this point that the amplifying apparatus 15a may comprise one or more amplifiers or amplifier stages—for example, connected in series as well. It is also possible that the at least one amplifier itself is not, or is predominantly not, controllable, or at least is not controlled, because it cooperates, for example, with an additional attenuation apparatus which is preferably connected upstream of the amplifying apparatus in the signal transmission direction. In this case, the attenuation apparatus can be actuated such that the attenuation value is changed in such a way that the desired amplification can be produced in the interaction of the attenuation apparatus with the amplifying apparatus. In this case, a corresponding adjustment value is output to the attenuation apparatus via the output device 17, the detector apparatus 21 and the adjustment and/or control apparatus 25, as a result of which the attenuation and thus, in conjunction with the at least one amplifier, the total amplification is accordingly adjustable or controllable. Also in this regard, reference is made to known solutions.

The aforementioned circuit apparatus for the compensation of signals, in particular of transmission signals which are transmitted from the mobile communications device in the direction of the base station, can be used mainly (but not exclusively) in vehicles in order to compensate for the attenuation between the mobile phone (generally: mobile communications device) and an antenna 7 which is preferably provided on the motor vehicle as an external antenna. The attenuation can, as already mentioned, arise from the RF cables and/or from the wireless coupling between the mobile communications device 5 and the coupling apparatus 3 (the "cradle").

Preferably, the existing attenuation is compensated for by a bidirectional amplification of the mobile communications signal being implemented. The compensation apparatus in this case should preferably support not just one but—in most cases—a plurality of mobile communications bands. The structure must therefore—in contrast to FIG. 1—be implemented for the corresponding bands with multiple transmission lines, such that it is possible for example to measure the level of the mobile communications transmission signal for preferably all the frequency bands to be transmitted, and to then adjust a corresponding attenuation or amplification value via the corresponding control and regulation line.

When such a circuit apparatus is used for compensation, the problem is that the attenuation to be compensated for is largely unknown. In the evaluation, for example the magnitude of an attenuation between a mobile communications device and the coupling apparatus is therefore usually assumed if this attenuation value assumes a maximum value or a minimum value.

On the basis of these extreme values, however, the problem always arises that an "overcompensation" or "under-compensation" can occur. This is always the case if the compensator provides a higher or lower amplification than when the attenuation caused in the circuit arrangement is actually lower or higher in contrast.

If under-compensation results, this leads to a reduced cell size (in other words, the range of a mobile communications device is reduced). In the event of overcompensation, this can lead, on the one hand, to the maximum permitted output power at the antenna carrying out the communication with a base station being exceeded (that is, deviating from the transmission strength prescribed by the base station according to regulations, and/or from the load limits of the components), and on the other hand, the mobile communications device can no longer reduce the transmitting power at the antenna to the required minimum output power.

Below, the way in which previous amplification controls have been operated for an aforementioned compensator circuit arrangement is explained with reference to FIG. 2.

Here, on the abscissa—that is, the X-axis—the input power $P_{CRD}$ [dBm]—that is, the detected input signal level for different values—measured at the input of the coupling apparatus (i.e. at the connector 4a for the mobile communications device of the circuit arrangement—that is, the compensator circuit) is illustrated for different values—that is, for input signal levels fed into the circuit apparatus by the coupling apparatus 3 (particularly when a mobile communications device is placed in a holder which forms the coupling apparatus). On the ordinate—that is, the Y-axis—the total amplification G (gain) is given in dB.

$G_{min}$ and $G_{max}$ indicate a minimum and a maximum signal amplification.

In a first amplification region X1, the detection sensitivity is indicated along the dot-dash line A. This value A thus reflects the maximum detection sensitivity at which the detection apparatus can still detect an input signal level (above the noise). The detection sensitivity A thus represents nothing more than a lowermost threshold or trigger value $S_{EP}$, by means of which the presence of an input or transmission signal coming from the mobile communications device 5 via the coupling apparatus 3 can be detected.

This detected or detectable input signal level $S_{EP}$ above which the compensator circuit arrangement detects the corresponding mobile communications band and is able to provide amplification and to adjust the amplification based on the measured input power, is also referred to below as the input signal detection level $S_{EP}$.

Figure 2:
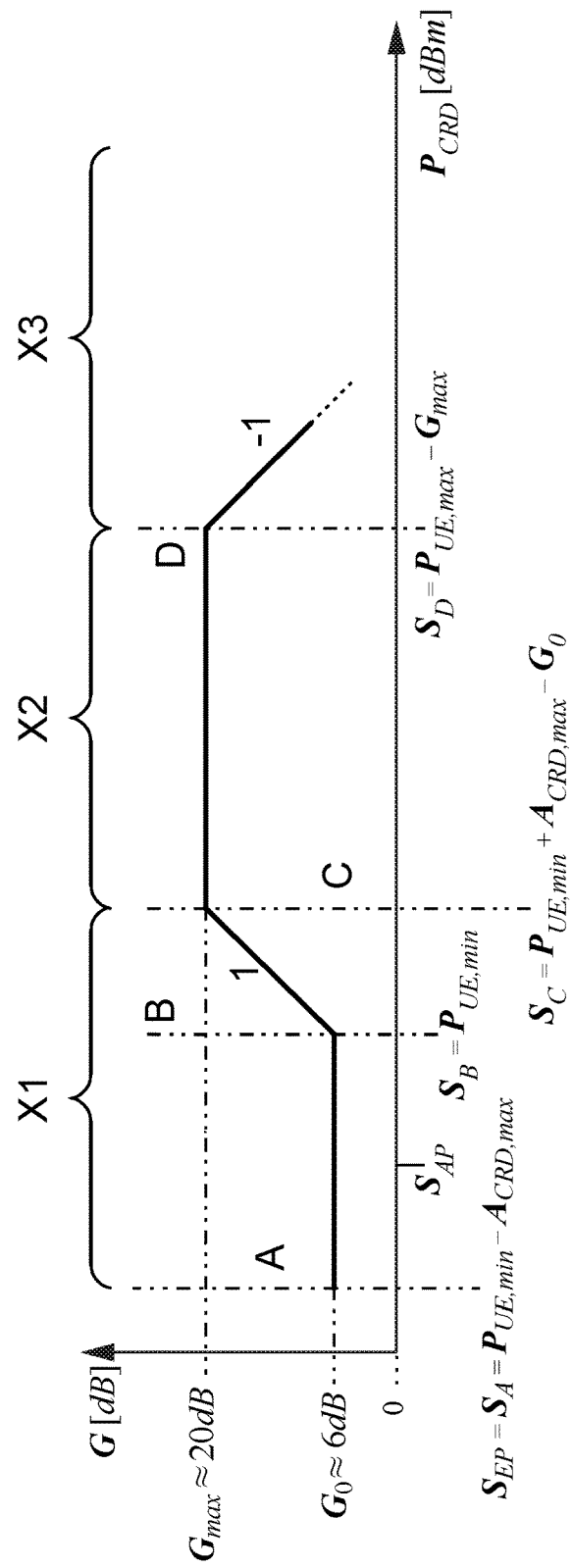
FIG. 2: shows a graphic which explains the amplification and attenuation control as typically provided in the prior art.

This detection sensitivity is set to a value, according to previously known solutions, which would occur in the worst possible conditions. These worst possible conditions involve the mobile communications device transmitting at the lowest possible power while the attenuation prespecified in the circuit arrangement (which further reduces the input signal level) simultaneously assumes a maximum possible value. Under these conditions, the following detection sensitivity accordingly results:

minimum mobile communications device output power–maximum coupling apparatus attenuation This is expressed in FIG. 2 as $$P_{UE,min} - A_{CRD,max}$$

The detection sensitivity mentioned above may, for example, be adjusted in such a manner that input signal levels which have a value of at least −60 dBm are still detected. For example, a good value would be −70 dBm. This value is based on the minimum transmission level in the UMTS mobile communications method of −50 dBm, such that, taking into account an assumed maximum cradle attenuation of 20 dB, the above-mentioned value of −70 dBm is ultimately obtained. However, values for the detection sensitivity which deviate therefrom, such as −65 dBm or −60 dBm, would also be possible. In particular, in the case of the LTE mobile communications method, a value of −50 dBm would be recommended as the upper limit.

As can be seen from the diagram of FIG. 2, only a reduced amplification is provided at detected input signal levels—that is, at input signal levels above the detection sensitivity up to a threshold discussed later. This is to ensure, on the one hand, that the output power at an antenna 7 can be lowered to for example −50 dBm when the mobile communications device is in the vicinity of a base station.

This should accordingly prevent overcompensation of low transmission levels of the mobile communications device in any case. This should therefore also ensure that the mobile communications device can produce the required minimum output power at the antenna 7, which is typically a vehicle—or external antenna. The initial amplification factor $G_0$ included in the graph of FIG. 2 is set in such a manner that it has the desired value for the lowest expected coupling attenuation. In contrast, if the coupling attenuation is greater, then the amplification factor is even lower, so as to—as mentioned—reliably rule out the chance of an overcompensation. According to the discussed example according to the prior art according to FIG. 2, this initial amplification factor $G_0$ is chosen to be a constant value of, for example, 6 dB. In this regard, reference is also made to the prior publication DE 10 2013 101 590 A1, which describes how a value $V_{min}$ is determined.

Until the minimum mobile communications device output power $P_{UE,min}$ (Y-axis; line B) is reached, the circuit arrangement accordingly operates with a low, reduced, constant amplification.

After the minimum mobile communications device output power $P_{UE,min}$ is reached, the input signal levels (of the compensator) above this mobile communications device output power are amplified up to a prespecifiable level value (threshold) with a reduced amplification. This should prevent overcompensation in any case, particularly at a low transmission level of the mobile communications device. This ensures that the mobile communications device can provide the required minimum output power at the antenna 7—that is, for example, the vehicle or exterior antenna 7. In the prior art, the amplification for this case is determined based on the lowest expected coupling attenuation. In the embodiment shown in FIG. 2, this corresponds to a value of 6 dB, for example.

As soon as the signal input level P measured at the coupling apparatus 3 is greater than the minimum mobile communications device output power+maximum possible compensator amplification−minimum coupling attenuation, that is, according to the formula $P_{UE,min} + A_{CRD,max} - G_0$, there is no longer any danger that overcompensation will occur.

In the graphic according to FIG. 2, this is illustrated along the dash-dotted line UGW. In this case, a lower threshold UGW is reached. From then on, the amplification is preferably implemented with a constant amplification $G_{max}$ (i.e. with a constant maximum amplification value) or, preferably, with an amplification which is only slightly lower. In other words, therefore, the detected input signal level of the compensator is increasingly more strongly amplified once the input signal detection level $S_{EP}$ is reached—specifically until the lower limit value UGW is reached. Subsequently, the amplification is carried out with the same value at the highest level $G_{max}$ or, as mentioned, slightly below, if appropriate.

In other words, therefore, the amplification of the circuit arrangement is changed at this point—that is, at the transition from the first-mentioned region X1 to the second region X2 in FIG. 2. This is because, at the above-mentioned threshold indicated with the dash-dotted line UGW, the compensator can now work preferably at its maximum amplification $G_{max}$ in the entire region X2.

The transition from the region X1 into the region X2 takes place abruptly in the prior art—for example, according to the prior publication DE 20 2014 010 732 U1—by means of a jump function.

This preferred maximum amplification is maintained until the signal input level at the coupling apparatus 3 is the upper value $P_{UE,max} - G_{max}$.

Figure 3:
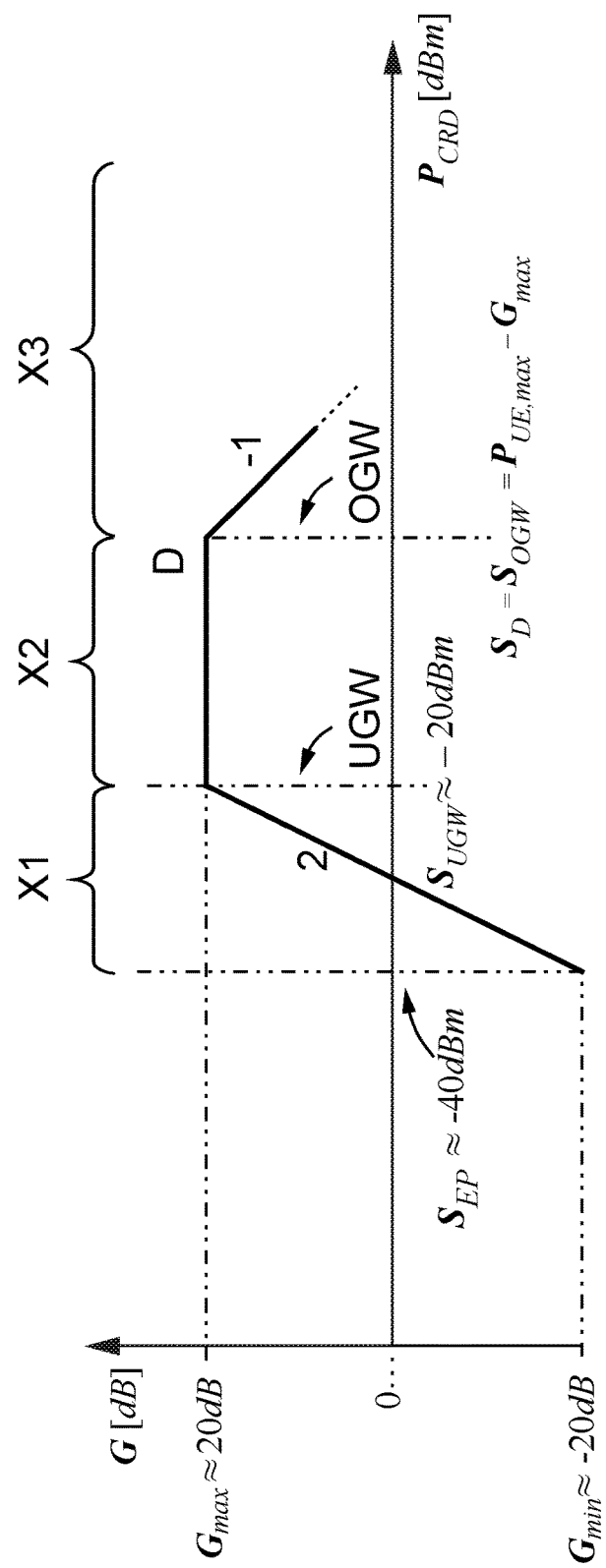
FIG. 3: shows a graphic which explains the amplification behaviour of the circuit arrangement according to an embodiment.

To ensure that the maximum transmission power in this third region X3 is not exceeded at the external or vehicle antenna, the amplification of the compensator must be increasingly reduced with an input power which increasingly exceeds the value $P_{UE,max} - G_{max}$. For this purpose, the curve of the amplification plotted against the input power, as shown in FIG. 3, expediently has a slope of −1.

In contrast, the solution according to example non-limiting embodiments will now be discussed with reference to the diagram according to FIG. 3.

To avoid the above-described ping-pong effect, and to achieve the desired overall improvement of the circuit arrangement, the method according to example non-limiting embodiments for amplification will be described below by means of the above-described circuit arrangement.

The regions X2 and X3 explained with reference to FIG. 2 are retained in the control method and control system response. Reference is made in this regard to the above description.

In any case, the method according to example non-limiting embodiments and/or the operation of the circuit arrangement differs significantly in the initial region X1 explained above.

From the diagram according to FIG. 3, it can be seen that, according to example non-limiting embodiments, the detection sensitivity with respect to input signal levels coming from the coupling apparatus 3 is significantly shifted to higher input powers and/or higher input levels. Only the input signal levels fed into the compensator above the input signal detection level $S_{EP}$ can be specifically detected by the circuit arrangement and/or the detector apparatus 21.

In the context of example non-limiting embodiments, any reduction in the detection sensitivity made in contrast to the prior art, and thus any increase in the input signal detection level $S_{EP}$, leads to an improvement. As mentioned, the reduction of the detection sensitivity, and thus the increase of the input signal level which can be detected by the detector apparatus should preferably differ significantly from the prior art.

Therefore, the detected input signal levels which are recognisable and detected by the detector apparatus 21 should preferably be greater by at least 10 dB to 20 dB than those of the prior art.

Below this input signal detection level $S_{EP}$, an input signal coming from the coupling apparatus 3 and/or an input signal level coming from the coupling apparatus 3 is not recognised at all by the circuit arrangement in general, and by the detector apparatus 21 in particular, and therefore no amplification or attenuation control is undertaken as a result. It would also be possible to have a circuit arrangement in which higher input signal levels, even higher than the input signal detection level $S_{EP}$, are basically recognised, but nevertheless no amplification is initiated or carried out. This can be done, for example, by the detector apparatus 21, which in such a case, rather than causing the adjustment and/or control apparatus 25 to set an amplification value in the amplification device with a detected input signal level above the input signal detection level $S_{EP}$, only does so once a "trigger level" which can be adjusted and/or preselected above the input signal detection level $S_{EP}$ is exceeded. Such an input signal trigger level $S_{AP}$ is shown by way of example in FIG. 2. The corresponding adjustment control does not necessarily have to be carried out by the detector apparatus 21—it can also be performed in conjunction with the adjustment or control apparatus 25.

If a detected input signal or a detected input signal level is so weak that it is still below the input signal detection level $S_{EP}$ of the input signal level, no amplification is performed by the amplifying apparatus. In this case, the amplifier is preferably switched off or de-energised—also in order to save energy. The amplifier could also be switched into maximum attenuation, such that the compensator only provides the detected input signal and/or the detected input signal level with a signal path which has an attenuation, defined according to FIG. 3, if the input signal detection level $S_{EP}$ or the above-mentioned input signal trigger level $S_{AP}$, which can be pre-selected as higher than the input signal detection level $S_{EP}$, is reached or exceeded.

Thus, if the detected input signal level measured on the transmission path by the detection apparatus 21 is less than the specified value for the input signal detection level $S_{EP}$ or less than the aforementioned prespecifiable or prespecified input signal trigger level $S_{AP}$, amplification does not take place, such that the circuit arrangement is in an "idle" state. Therefore, no transmission and amplification path is offered by the circuit arrangement, unless the signal is overcoupled, such that the mobile communications device within the vehicle or cabin body 2 can only communicate directly with the base station, and receives the corresponding values for setting a signal level from the base station (thereby also compensating for losses due to the vehicle or cabin body). This is particularly important for a position close to the base station, where the transmission signals are emitted at a low level anyway by the device. Only once the detected input signal level reaches or exceeds the mentioned input signal detection level $S_{EP}$ or the mentioned input signal trigger level $S_{AP}$ above the same, is the detected input signal and/or the detected input signal level amplified on the mentioned signal and transmission line by the circuit arrangement in the described scope—that is, partially attenuated or amplified.

As is known, the mobile communications device transmits in the described scenarios—that is, in the case of a detected input signal level below the input signal detection level $S_{EP}$—with the transmission level it was instructed to use by the base station. This transmission signal level can only be reduced by the prespecified attenuation of the circuit apparatus, however.

After detection of a transmission signal level, if the input signal detection level $S_{EP}$, which acts as the initial detection threshold or trigger, is exceeded, in contrast to previously known solutions not only is the detected input signal level not amplified, but also, according to example non-limiting embodiments, the input signal level is preferably also attenuated.

Likewise, it is of course possible that the circuit arrangement is constructed in such a manner that even the input signal level of the compensator measured at the input of the compensator, applied thereto, or detected there is recognised once the input signal detection level $S_{EP}$ is reached but the amplifier circuit remains switched off, or the relevant amplifier is switched out of the amplification path, or is operated in an "idle mode"—and particularly at least in a range up to an aforementioned higher input signal trigger level $S_{AP}$. In this case, therefore, the communication between the mobile communications device and the base station can be conducted while bypassing the amplifier. Otherwise, the circuit may, as mentioned, be designed in such a manner that only after an input signal trigger level $S_{AP}$ is exceeded is the amplifier switched—that is, energised or activated and/or connected in the amplification path to carry out the desired signal processing. In this regard, the behaviour for triggering by an input signal triggering level $S_{AP}$ is analogous to triggering by the mentioned input signal detection level $S_{EP}$. A change and or different setting occurs only via the triggering threshold.

Moreover, it should also be noted at this point that the above-described compensator preferably has a broadband downlink amplifier path which can be used in "idle mode"—at least as long as no transmitting frequency band has been recognised and/or a lower value with respect to the signal level has not been exceeded.

It can be seen from FIG. 3 that, when the transmission signal detection level $S_{EP}$ is exceeded, a maximum attenuation is initially performed by the circuit arrangement. A rapid increase in amplification then takes place proceeding from this lowest value—which may be, for example, −20 dB—as the input signal level increases, until the input signal level reaches a lower threshold UGW, at which the amplification has risen to a maximum value $G_{max}$. This threshold UGW is also the end of the control range X1. The rapid increase in amplification in the region X1 can occur, for example, with a slope of +2. More generally, values that are greater than or equal to a slope factor of 1.1 or greater—that is, preferably a slope or amplification factor of at least 1.2; 1.3; 1.4; 1.5; 1.6; 1.7; 1.8; 1.9 or even, preferably, 2 are advantageous. Higher amplification factors are also possible, amplification factors below a value +3, in particular below a value of +2.9; +2.8; +2.7; +2.6; +2.5; +2.4; +2.3; +2.2 or at least +2.1, being preferred.

The described adjustment of the amplification in the range X1 is preferably carried out using low-pass characteristics to prevent decay of the two controls—specifically the first control implemented by the circuit arrangement, and the second control permanently implemented by the communication between the base station and the mobile communications device to change the strength—that is, the level—of the transmission signals, the circuit arrangement amplification preferably being adjusted with a much higher time constant compared to the control of the transmission power of the mobile communications device by the base station, and also on the basis of an averaged value of the transmission power of the mobile communications device.

This control and amplification of the described transmission signals according to example non-limiting embodiments also avoids the disadvantageous ping-pong effect described in the prior art. Specifically:

If the mobile communications device having the circuit arrangement is positioned near a base station, the mobile communications device transmits with a transmission power which is not sufficient, in general, to reach the input signal detection threshold $S_{EP}$ of the circuit arrangement—that is, of the compensator explained above; since the circuit arrangement—that is, the compensator described above—is in an idle state, the circuit arrangement also offers no transmission and amplification path. Therefore, the mobile communications device transmits while bypassing the circuit arrangement, and is connected with the base station while bypassing the circuit arrangement, such that the transmission signal of the mobile communications device also undergoes additional attenuation namely, an attenuation which is caused by the motor vehicle body (in general, the surrounding shell in which the mobile communications device is located). This can also be called a "penetration loss".

If the mobile communications device (for example, together with an associated vehicle) travels away from the base station, the transmission level of the mobile communications device increases—specifically as a result of instructions from the base station. This increase in the transmission level is performed until the detection threshold $S_{EP}$ for the input signal detection level $S_{EP}$ is reached. Once the detected input signal level is recognised (after the detection threshold in the form of the input signal detection level $S_{EP}$ or the mentioned higher input signal trigger level $S_{AP}$ has been exceeded), the detector apparatus 21 can emit a corresponding signal to the control apparatus 25, which then controls the amplifier 15a. As a result, on the one hand, the recognised—that is, the detected—input signal is patched through by the circuit arrangement for the respective band. In the context of example non-limiting embodiments, the special characteristic is that the circuit arrangement does not offer the conducting path 9, 9a having an amplification—but rather an initial attenuation. This attenuation is in the range of the input signal detection level $S_{EP}$ and is approximately in the order of magnitude corresponding to the losses caused by the vehicle shell (the vehicle body) ("penetration loss").

If the transmission power of the transmission signal coming from the coupling apparatus (triggered by the mobile communications device) increases further, the circuit arrangement further increases the amplification of the respective path—in the illustrated embodiment, of path 9a. This occurs until the maximum amplification $G_{max}$ is reached (FIG. 3);

Since no sudden jumps in the amplification and/or attenuation behaviour should be expected over the entire range of the existing attenuation as a result of this specific amplification circuit, and thus the above-mentioned specific amplification method, the described ping-pong effect does not occur.

At high mobile communications signal levels, the circuit arrangement, that is, the compensator, preferably works at maximum amplification. The situation is comparable to the placement of a mobile communications device outside a vehicle.

From the overall construction, it can thus be seen that—if a mobile communications device is located, for example, in a vehicle—two transmission paths are always available, namely:

1. a transmission path from the mobile communications device through the vehicle body (or through the shell of a corresponding cabin in which the mobile communications device is located), in which case the transmission level of the transmission signal sent from the mobile communications device is still subject to attenuation—specifically, the "penetration loss" caused by the shell of the cabin of the vehicle, or 2. a transmission path in which, as described, the transmission signal of the mobile communications device is initially attenuated for lower input signal levels, and then is increasingly more strongly attenuated, via the coupling apparatus 3 and the aforementioned circuit arrangement (compensator), compensation which counteracts the attenuation being implemented by the circuit arrangement (compensated for loss).

Finally, it is again noted that, unlike in the embodiment as shown with reference to FIG. 2, example non-limiting embodiments can also be constructed for a plurality of bands, the different levels for the different bands being accordingly detected by the detector apparatus, and it being necessary to actuate the amplifying apparatus accordingly in a receptacle tuned thereto.

Finally, it should also be noted that not only can the detector apparatus implement the corresponding control—that is, the amplification and/or attenuation, etc.—based on the transmission signals transmitted by the mobile communications device, but the detector apparatus can also perform a corresponding amplification or attenuation function with respect to the transmission signals according to the signals transmitted by a mobile communications station to the mobile communications device—that is, the received signals.

The present discussion often refers not only to transmission signals, but also to transmission signal levels. Wherever transmission signal levels are mentioned, transmission power can be used with the same meaning. A restriction to one of the above two terms is not implied.

While the invention has been described in connection with example non-limiting embodiments, the invention is not to be limited to the embodiments but shall instead encompass the spirit and scope of the appended claims.

The invention claimed is:

1. Circuit arrangement for compensating for signal attenuation during the transmission of transmission signals of a mobile communications device, comprising:
    a signal line having at least one signal path,
    an adjustable input signal level amplifying apparatus which has at least one amplifier for amplifying the detected input signals or input signal level,
    a detector apparatus which is designed to detect the associated input signal level in the circuit arrangement with respect to the transmission signals,
    an adjustment or control apparatus for adjusting an amplification of the input signals or input signal levels carried out by the amplifier,
    the detector apparatus being connected to the adjustment or control apparatus,
    the detector apparatus and/or the adjustment or control apparatus being designed in such a manner that
        a) the at least one amplifier is switched out of the signal transmission path or is deenergized, or the amplifier does not amplify, attenuate or forward the transmission signal unless a received signal level is detected which is greater than or equal to the input signal detection level ($S_{EP}$) or greater than or equal to a trigger level ($S_{AP}$) which is at most 10 dB greater than said detection level,
    and/or
        b) the amplifier is operated at a variable amplification factor in an adjustment range (X1) which begins at a lower input signal detection level ($S_{EP}$) or a trigger level ($S_{AP}$) which is at most 10 dB above the input signal detection level ($S_{EP}$), and extends to cover higher signal levels than these, wherein, if the input signal detection level ($S_{EP}$) is reached or exceeded, or the trigger level ($S_{AP}$) is reached or exceeded, the input signal is either non-amplified or is attenuated at an amplification factor≤1.

2. Circuit arrangement according to claim 1, wherein the detector apparatus and/or the adjustment or control apparatus is/are designed in such a manner that an input signal having an input signal level below the input signal detection level ($S_{EP}$) or below the trigger level ($S_{AP}$) is not detected, or is detected but not amplified, attenuated or forwarded.

3. Circuit arrangement according to claim 1, wherein the detector apparatus and/or the adjustment or control apparatus is/are configured to cause the amplifier to initially attenuate the detected input signal if the input signal detection level ($S_{EP}$) or the trigger level ($S_{AP}$) is/are reached or exceeded, and to initially reduce the attenuation of the input signal when signal levels are increasing, and to then change to an increasing amplification at an increasing amplification factor greater than 1, up to a maximum amplification value ($G_{max}$) which is reached when the detected input signal level reaches a lower value (UGW).

4. Circuit arrangement according to claim 1, wherein the detector apparatus (is designed, and a prespecifiable input signal detection level (SEP) or a trigger level (SAP) is at most 10 dB higher than the same prespecified in such a manner that only transmission signals having a signal level which is at least 5 dB, at least 10 dB, 15 dB, 20 dB, 30 dB or up to 40 dB higher than the minimum transmission signal level of a mobile communications device are detected.

5. Circuit arrangement according to claim 1, wherein the input signal level ($S_{EP}$) or the trigger level ($S_{AP}$) which is at most 10 dB higher has values which lie at least between −80 dBm, at least between −70 dBm or −50 dBm and −20 dBm, or −40 dBm.

6. Circuit arrangement according to claim 1, wherein the detector apparatus and/or the adjustment or control apparatus is/are designed in such a manner that, after the input signal detection level ($S_{EP}$) or the trigger level ($S_{AP}$) which is at most 10 dB higher than the same has been reached or exceeded, the input signal is attenuated by −5 dB to −30 dB, to a value of more than −10 dB, or at least −15 dB and less than −25 dB, or by such an amount that the vehicle body shell attenuation is reached at a deviation of less than +/−40%, +/−30% or in particular +/−20%.

7. Circuit arrangement according to claim 1, wherein the detector apparatus and/or the adjustment or control apparatus is designed in such a manner that the input signal is increasingly more strongly amplified in an adjustment range between the input signal detection level ($S_{EP}$) or a trigger level ($S_{AP}$) which is at most 10 dB higher than the same, and an upper value (UGW) as the input signal level increases, in particular up to a maximum amplification value ($G_{max}$).

8. Circuit arrangement according to claim 1, wherein the adjustment and/or control apparatus for adjusting the amplification factor in the amplifier is designed in such a manner that, after the input signal detection level ($S_{EP}$) or a trigger level ($S_{AP}$) which is at most 10 dB above the same is exceeded, the input signal is amplified at a slope of more than 1.1, in particular more than 1.2; 1.3; 1.4; 1.5; 1.6; 1.7; 1.8; 1.9, and at a slope of less than 3.0; 2.9; 2.8; 2.7; 2.6; 2.5; 2.4; 2.3; 2.2, and in particular 2.1, or at a slope of 2.

9. Circuit arrangement according to claim 1, wherein the detector apparatus and/or the adjustment or control apparatus is/are designed in such a manner that the amplification factor of the at least one amplifier is downregulated at a negative slope as the detected input signal level increases further, as long as the detected input signal level exceeds an upper value (OGW), which is expressed as the difference between the maximum transmission power and the maximum amplification power according to the formula $P_{UE,max} - G_{max}$.

10. Method for compensating for signal attenuation during the transmission of transmission signals of a mobile communications device, comprising:
an adjustable input signal level amplifying apparatus is used having at least one amplifier to amplify the detected input signals,
a corresponding input signal is detected by means of a detector apparatus,
an adjustment or control apparatus is used to adjust a signal amplification of the input signals generated by the amplifier, and
a) the at least one amplifier is switched out of the signal transmission path or is deenergized, or the amplifying apparatus does not amplify, attenuate or forward the detected input signal, unless an input signal level is detected which is greater than or equal to the input signal detection level ($S_{EP}$) or a trigger level ($S_{AP}$) which is at most 10 dB higher than the same,
and/or
b) the amplifier is operated at a variable amplification factor in an adjustment range (X1) which begins at an input signal detection level ($S_{EP}$) or a trigger level ($S_{AP}$) which is at most 10 dB higher than the same, and extends to higher signal levels than these, wherein, if the input signal detection level ($S_{EP}$) or the trigger level ($S_{AP}$) is reached or exceeded, the input signal is either non-amplified or is attenuated at an amplification factor≤1.

11. Method according to claim 10, wherein the mobile communications device communicates directly with a mobile communications base station, bypassing the amplifier, when its input signal fed into the circuit arrangement via a coupling apparatus has an input signal level which is below an input signal detection level (SEP) or a trigger level (SAP) which is at most 10 dB higher than the same, and/or is not detected due to the prespecified detection sensitivity of the detection apparatus.

12. Method according to either claim 10, wherein the detection sensitivity of the detector apparatus which is used is adjusted in such a manner that an input transmission signal having an input signal level below an input signal detection level ($S_{EP}$) is not detected, or is detected but not amplified, attenuated or forwarded.

13. Method according to claim 10, wherein, if the input signal detection level ($S_{EP}$) or a trigger level ($S_{AP}$) which is at most 10 dB higher than the same is reached or exceeded, the amplifier is prompted to initially attenuate the input transmission signal, and to initially decrease the attenuation of the detected input signal as the input signal levels increase, and to then change to an increasing amplification at an amplification factor greater than 1, up to a maximum amplification value ($G_{max}$) which is reached when the detected input signal level reaches a lower value (UGW).

14. Method according to claim 10, wherein an input signal detection level ($S_{EP}$) or a trigger level ($S_{AP}$) which is at most 10 dB higher than the same is prespecified in such a manner that only transmission signals having a signal level which is at least 5 dB, at least 10 dB, 15 dB or up to 20 dB above the minimum transmission signal level of a mobile communications device are detected.

15. Method according to claim 10, wherein the input signal detection level ($S_{EP}$), or a trigger level ($S_{AP}$) which is at most 10 dB higher than the same, is adjusted to values which are at least between −80 dBm, at least between −70 dBm or −50 dBm and −20 dBm, or −40 dBm.

16. Method according to claim 10, wherein, after the input signal detection level ($S_{EP}$) is reached or exceeded, or after the input signal trigger level ($S_{AP}$) is reached or exceeded, the detected input signal is attenuated by −5 dB to −30 dB, to a value of more than −10 dB, or at least −15 dB and less than −25 dB.

17. Method according to claim 10, wherein the detected input signal is increasingly more strongly amplified in an adjustment range between the input signal detection level ($S_{EP}$) or the input signal trigger level ($S_{AP}$) and an upper value (UGW) as the input signal level increases, in particular up to a maximum amplification value ($G_{max}$) which corresponds to the lower value (UGW) in the case of a transmission signal level.

18. Method according to claim 10, wherein, after the input detection level ($S_{EP}$) or the input signal trigger level ($S_{AP}$) is exceeded, the detected input signal is amplified at a slope of more than 1.1, in particular more than 1.2; 1.3; 1.4; 1.5;

1.6; 1.7; 1.8; 1.9, and at a slope of less than 3.0; 2.9; 2.8; 2.7; 2.6; 2.5; 2.4; 2.3; 2.2, and in particular 2.1, at a slope of 2.

19. Method according to claim 10, wherein the detected input signal is at least approximately amplified at a constant amplification or at an amplification which is below a maximum value ($G_{max}$) while the detected input signal level is becoming greater, as soon as the detected input signal level reaches or passes a lower value (UGW).

20. Method according to claim 10, wherein the amplification factor of the at least one amplifier is down-regulated at a negative slope when the detected input signal level increases further, as long as the detected input signal level goes beyond an upper value (OGW), which is expressed as the difference between the maximum transmission power and the maximum amplification ($P_{UE,max} - G_{max}$).

* * * * *